(12) United States Patent
Dunwoody et al.

(10) Patent No.: US 9,270,059 B2
(45) Date of Patent: Feb. 23, 2016

(54) ELECTRICAL CONNECTOR HAVING AN EMI ABSORBER

(71) Applicant: Tyco Electronics Corporation, Berwyn, PA (US)

(72) Inventors: Steven David Dunwoody, Middletown, PA (US); Richard James Long, Columbia, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 136 days.

(21) Appl. No.: 13/964,768

(22) Filed: Aug. 12, 2013

(65) Prior Publication Data

US 2015/0044909 A1    Feb. 12, 2015

(51) Int. Cl.
*H01R 9/03* (2006.01)
*H01R 13/6593* (2011.01)
*H01R 13/7193* (2011.01)
*H05K 9/00* (2006.01)
*H01R 13/6599* (2011.01)

(52) U.S. Cl.
CPC ........ *H01R 13/6593* (2013.01); *H01R 13/7193* (2013.01); *H05K 9/0018* (2013.01); *H01R 9/034* (2013.01); *H01R 13/6599* (2013.01)

(58) Field of Classification Search
CPC ............................ H01R 13/658; H01R 13/719
USPC ............. 439/607.56, 607.41, 607.51, 620.05, 439/620.07, 447
See application file for complete search history.

(56) References Cited

U.S. PATENT DOCUMENTS

| 5,052,947 | A | * | 10/1991 | Brodie et al. | 439/607.01 |
| 5,244,415 | A | * | 9/1993 | Marsilio et al. | 439/607.47 |
| 5,505,637 | A | * | 4/1996 | Kramer et al. | 439/607.48 |
| 5,562,497 | A | * | 10/1996 | Yagi et al. | 439/607.47 |
| 5,833,495 | A | * | 11/1998 | Ito | 439/607.48 |
| 5,895,292 | A | * | 4/1999 | Affeltranger | 439/607.56 |
| 5,910,030 | A | * | 6/1999 | Hollander et al. | 439/620.05 |
| 7,173,182 | B2 | * | 2/2007 | Katsuyama et al. | 174/36 |
| 7,384,313 | B2 | * | 6/2008 | Kuo | 439/620.07 |
| 7,507,120 | B1 | | 3/2009 | Bright et al. | |
| 8,491,328 | B2 | * | 7/2013 | Mulfinger et al. | 439/447 |
| 2005/0133245 | A1 | | 6/2005 | Katsuyama et al. | |
| 2008/0207054 | A1 | * | 8/2008 | Kim | 439/607 |
| 2013/0102185 | A1 | | 4/2013 | Mulfinger et al. | |

OTHER PUBLICATIONS

International Search Report issued in corresponding application No. PCT/US2014/049358, mailed on Oct. 22, 2014.

* cited by examiner

*Primary Examiner* — Hae Moon Hyeon

(57) ABSTRACT

An electrical connector is provided for terminating a cable having a cable shield. The electrical connector includes an electrical contact configured to be terminated to an end of a wire of the cable, and a housing having a body that extends from a mating end to a cable end. The housing includes a connector shield. The electrical contact is held by the housing. The cable end includes a cable channel that is configured to hold an end segment of the cable therein such that the cable shield is electrically engaged with the connector shield. An electromagnetic interference (EMI) absorber is held within the cable channel such that the EMI absorber is configured to extend around the cable shield along at least a portion of a length of the cable channel. The EMI absorber is configured to absorb EMI emitted from the cable.

18 Claims, 5 Drawing Sheets

ELECTRICAL CONNECTOR HAVING AN EMI ABSORBER

BACKGROUND OF THE INVENTION

The subject matter herein relates generally to an electrical connector for terminating an electrical cable having a cable shield.

Electrical connectors that terminate electrical cables may include a housing that provides shielding for one or more electrical contacts held by the housing. For example, the housing may include an electrically conductive coating (e.g., a plating), an electrically conductive shell, and/or another electrically conductive structure that extends around the electrical contacts for shielding the electrical contacts. The shield of the housing is terminated to a shield (e.g., a cable braid) of the cable that provides shielding for one or more electrical wires of the cable. The shielding provided by the housing shield and the cable shield may reduce electromagnetic interference (EMI) emissions from the cable assembly of the electrical cable and the electrical connector. EMI emitted from the cable assembly may harm the signal integrity and/or electrical performance of neighboring electrical devices, for example. Moreover, government regulations may require that EMI emissions from the cable assembly be contained to a predetermined level.

The EMI shielding of at least some known cable assemblies may be inadequate because of the increasing signal speeds being transmitted through cable assemblies. For example, the connection between the housing shield and the cable shield may leak EMI above certain signal speeds, such as above approximately 10 gigahertz (GHz). Some known cable assemblies wherein the cable shield is a cable braid that is dressed over a ferrule of the housing may be especially susceptible to EMI leakage at the interface between the cable braid and the ferrule because of the flare of the cable braid over the ferrule.

Accordingly, there is a need for an electrical connector that reduces EMI emissions.

BRIEF DESCRIPTION OF THE INVENTION

In an embodiment, an electrical connector is provided for terminating a cable having a cable shield that is electrically conductive. The electrical connector includes an electrical contact that is configured to be terminated to an end of a wire of the cable. The electrical connector also includes a housing having a body that extends from a mating end to a cable end. The housing includes a connector shield that is electrically conducive. The electrical contact is held by the housing. The housing is configured to mate with a mating connector at the mating end. The cable end includes a cable channel that extends through the body and is configured to hold an end segment of the cable therein such that the cable shield is electrically engaged with the connector shield of the housing. The electrical connector includes an electromagnetic interference (EMI) absorber held within the cable channel of the body of the housing such that the EMI absorber is configured to extend around the cable shield along at least a portion of a length of the cable channel. The EMI absorber is configured to absorb EMI emitted from the cable.

In an embodiment, a cable assembly includes a cable having an end segment. The cable includes a wire and an electrically conductive cable shield that extends around the wire. The cable assembly also includes an electrical connector terminated to the end segment of the cable. The electrical connector includes an electrical contact terminated to the wire of the cable, and a housing extending from a mating end to a cable end. The housing includes a connector shield that is electrically conducive. The electrical contact is held by the housing. The housing is configured to mate with a mating connector at the mating end. The cable end includes a cable channel that holds the end segment of the cable therein such that the cable shield is electrically engaged with the connector shield of the housing. An electromagnetic interference (EMI) absorber is held within the cable channel of the housing such that the EMI absorber extends around the cable shield along at least a portion of a length of the cable channel. The EMI absorber is configured to absorb EMI emitted from the cable.

In an embodiment, an electrical connector is provided for terminating a cable having a cable shield that is electrically conductive. The electrical connector includes an electrical contact that is configured to be terminated to an end of a wire of the cable, and a housing that extends from a mating end to a cable end. The housing includes a connector shield that is electrically conducive. The electrical contact is held by the housing. The housing is configured to mate with a mating connector at the mating end. The cable end includes a cable channel that is defined by an interior wall of the housing. The cable channel is configured to hold an end segment of the cable therein such that the cable shield is electrically engaged with the connector shield. The electrical connector includes an electromagnetic interference (EMI) absorber that is held within the cable channel such that the EMI absorber is configured to be disposed between the cable shield of the cable and the interior wall of the housing along at least a portion of a length of the cable channel. The EMI absorber is configured to absorb EMI emitted from the cable.

DETAILED DESCRIPTION OF THE INVENTION

Figure 1:
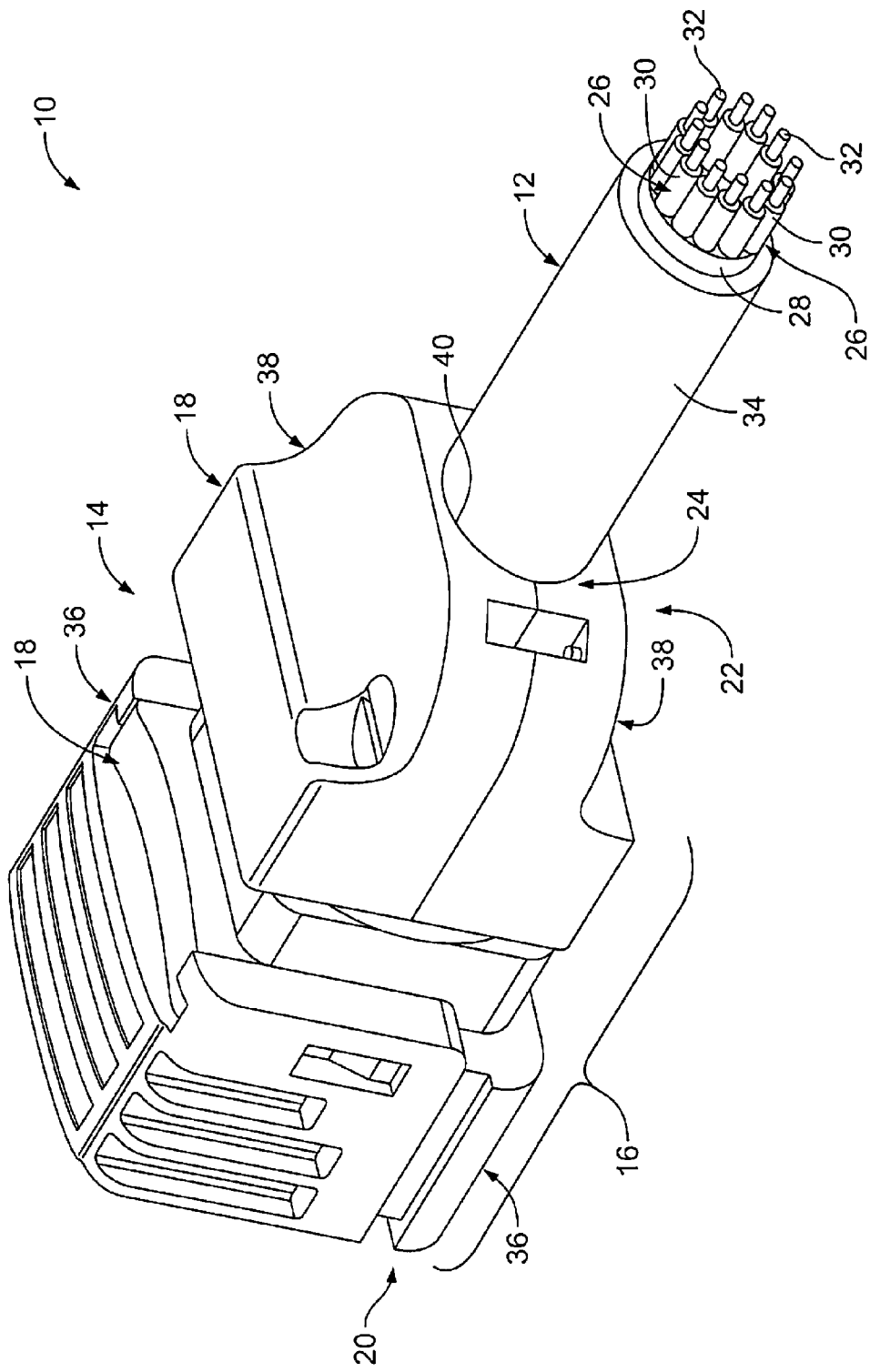
FIG. 1 is a perspective view of an embodiment of a cable assembly.

FIG. 1 is a perspective view of an embodiment of a cable assembly 10. The cable assembly includes a cable 12 and an electrical connector 14 that terminates the cable 12. In the illustrated embodiment, the electrical connector 14 is a shielded radio frequency (RF) connector, however the electrical connector 14 may be any other type of electrical connector. Optionally, the electrical connector 14 is a relatively high data rate connector. For example, in some embodiments, the electrical connector 14 is configured to transmit high-speed data signals, such as, but not limited to, data signals greater than approximately 5 gigabit per second (Gb/s), data signals greater than approximately 10 Gb/s, data signals greater than approximately 15 Gb/s, or data signals greater than approximately 20 Gb/s. The electrical connector 10 may be used for any application and is optionally adapted for use in military applications, aerospace applications, automotive applications, industrial applications, commercial applications, communication equipment (e.g., computer servers, interne routers, and/or the like), and/or the like.

The electrical connector 14 includes a housing 16 having a body 18 that extends from a mating end 20 to a cable end 22. The electrical connector 14 is configured to mate with a mating connector (not shown) at the mating end 20 of the housing 16. The electrical connector 14 is configured to terminate an end segment 24 of an electrical cable 12 at the cable end 22 of the housing 16.

The cable 12 includes one or more electrical wires 26 and a shield 28 that extends around the electrical wires 26. Although twelve are shown, the cable 12 may include any number of the electrical wires 26. Optionally, the electrical wires 26 are arranged as twisted wire pairs that carry differential signals. Moreover, the electrical wires 26 are optionally arranged as shielded differential pairs where the electrical wires 26 are arranged in pairs that carry differential signals and each pair is shielded. Each electrical wire 26 may include an individual electrical insulation layer 30 that extends around an electrical conductor 32 of the electrical wire 26. In addition or alternatively to the individual electrical insulation layer(s) 30, the cable 12 may include an electrical insulation layer (not shown) that is disposed between the electrical wire(s) 26 and the shield 28 of the cable 12. For example, in some alternative embodiments, the cable 12 is a coaxial cable having a single central, and uninsulated, electrical wire 26 that is separated and electrically isolated from the shield 28 via an electrical insulation layer that extends coaxially between the single electrical wire 26 and the shield 28.

The shield 28 is electrically conductive to provide electrical shielding for the electrical wires 26. The shield 28 may define an electrical ground and/or shield pathway through the cable 12. The shield 28 may have any structure, such as, but not limited to, a braid, a sheath, metallic armor, and/or the like. The cable 12 optionally includes an electrically insulative jacket 34 that extends around the shield 28. The shield 38 may be referred to herein as a "cable shield".

In the illustrated embodiment, the body 18 of the housing 16 includes a frontshell 36 and a backshell 38 that is mounted to the frontshell 36. The frontshell 36 includes the mating end 20 of the housing 16, while the backshell 38 includes the cable end 22 of the housing 16. In some alternative embodiments, the body 18 of the housing 16 does not include separate front and backshells, but rather defines a single, unitary body 18 that extends from the mating end 20 to the cable end 22. The cable end 22 of the housing 16 includes a cable channel 40 that extends through the body 18 of the housing 16. In the illustrated embodiment, the backshell 38 includes the cable channel 40 such that the cable channel 40 extends through the portion of the body 18 that is defined by the backshell 38. The cable channel 40 is configured to hold the end segment 24 of the cable 12 therein such that the back shell 38 supports the cable end segment 24. The cable channel 40 is better illustrated in FIGS. 2-4. As will be described in more detail below, the electrical connector 14 includes an electromagnetic interference (EMI) absorber 42 (FIGS. 2-5) that is held within the cable channel 40 and is configured to absorb EMI emitted from the cable 12.

Figure 2:
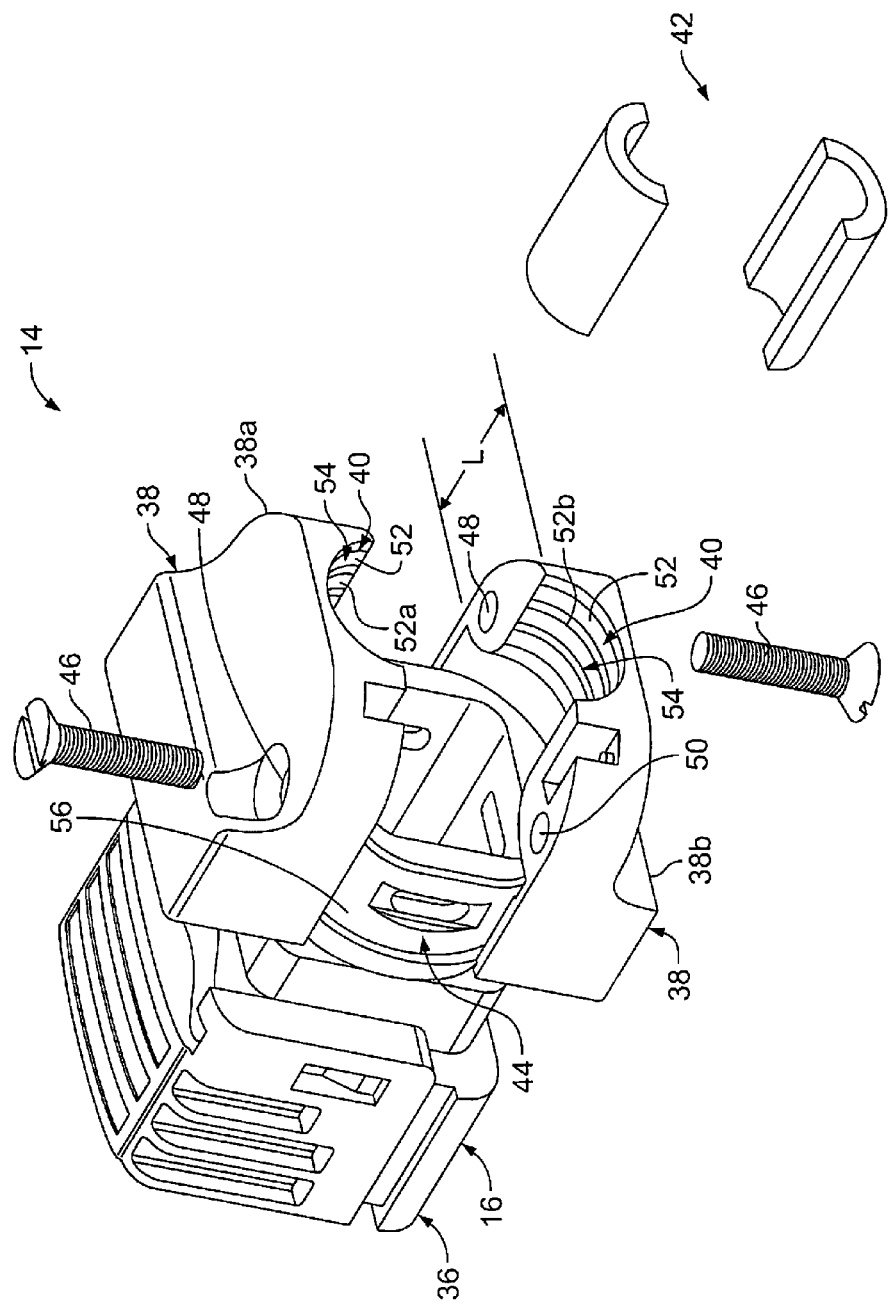
FIG. 2 is an exploded perspective view of an embodiment of an electrical connector of the cable assembly shown in FIG. 1.

FIG. 2 is an exploded perspective view of an embodiment of the electrical connector 14. The backshell 38 of the housing 16 is configured to be mounted to an optional fitting 44 of the frontshell 36 of the housing 16. The backshell 38 optionally includes discrete sub-shells 38a and 38b that connect together to define the backshell 38. Optionally, the discrete sub-shells 38a and 38b are substantially identical and/or hermaphroditic. For example, the discrete sub-shells 38a and 38b are optionally fabricated using the same mold. The discrete sub-shells 38a and 38b are optionally connected together at a hinge (not shown). Although two are shown, the backshell 38 may include any number of discrete sub-shells that connect together to define the backshell 38. Alternatively, the back shell 38 is defined by a single shell, such as, but not limited to, a single rigid shell, a single shell having two or more integrally-formed sub-shells that are connected together at a hinge, and/or the like.

In the illustrated embodiment, the sub-shells 38a and 38b of the backshell 38 connect together using threaded fasteners 46. The threaded fasteners 46 extend through openings 48 of the sub-shells 38a and 38b and threadably engage threaded holes 50 of the sub-shells 38a and 38b to secure the sub-shells 38a and 38b together. In addition or alternatively to the threaded fasteners 46, openings 48, and/or threaded holes 50, any other structure, method, means, connection type, and/or the like may be used to connect the sub-shells 38a and 38b together, such as, but not limited to, using a snap-fit connection, using a latch, and/or the like. Moreover, one or more of the threaded fasteners 46 may threadably engage a nut (not shown) instead of a threaded hole 50.

As described above, the backshell 38 includes the cable channel 40 that holds the end segment 24 (FIGS. 1 and 3-5) of the cable 12 (FIGS. 1 and 3-5). The cable channel 40 extends a length L through the backshell 38. The cable channel 40 is defined by an interior wall 52 of the backshell 38. Specifically, in the illustrated embodiment, an interior wall 52a of the sub-shell 38a of the backshell 38 defines approximately half of the cable channel 40, while an interior wall 52b of the sub-shell 38b defines the other approximate half of the cable channel 40. Although the cable channel 40 is shown as having a cylindrical shape, the cable channel 40 may additionally or alternatively include any other shape. The shape of the cable channel 40 may or may not be complementary with the shape of the cable 12.

The housing 16 of the electrical connector 14 includes a shield 54. The shield 54 is electrically conductive to provide electrical shielding for the electrical contacts 62 (FIG. 3) and for the end segment 24 of the cable 12. The shield 54 may define an entirety or a portion of an electrical ground and/or shield pathway along the housing 16. The shield 54 may be referred to herein as a "connector shield".

The connector shield 54 of the housing 16 may have any structure and location along the housing 16 that enables the connector shield 54 to electrically engage with the cable shield 28 (FIGS. 1 and 3-5) of the cable 12. For example, in the illustrated embodiment, the frontshell 36 of the housing 16 includes the connector shield 54. Specifically, an exterior surface 56 of the fitting 44 of the frontshell 36 includes the connector shield 54. As will be described below, the portion of the connector shield 54 that defines the exterior surface 56 of the fitting 44 is configured to electrically engage with the cable shield 28 to electrically connect the cable shield 28 to the frontshell 36 of the housing 16. As used herein, electrical engagement between two components is intended to mean that the two components are electrically connected together via direct physical engagement between the components or via physical engagement with an intermediate component that is engaged between the two components.

In the illustrated embodiment, the backshell 38 also includes the connector shield 54. The connector shield 54 extends along the length L of the cable channel 40. The connector shield 54 may extend along any portion(s) and amount of the length L of the cable channel 40. In the illustrated embodiment, the connector shield 54 extends along an approximate entirety of the length L of the cable channel 40. Optionally, the connector shield 54 defines an exposed surface of the backshell 38 that enables the backshell 38 to electrically engage with the frontshell 36 of the housing 16, for example at the exterior surface 56 of the fitting 44 defined by the connector shield 54 as is shown in FIG. 3.

As described above, the connector shield 54 may be defined by any structure of the housing 16. For example, the connector shield 54 may be provided by fabricating the frontshell 36, the sub-shell 38*a*, and/or the sub-shell 38*b* from a solid metallic (i.e., one or more metals and/or metal alloys) material such that the portion of the body 18 of the housing 16 that is defined by the frontshell 36, the sub-shell 38*a*, and/or the sub-shell 38*b* defines at least a portion of the connector shield 54. Another example of providing the connector shield 54 includes fabricating the frontshell 36, the sub-shell 38*a*, and/or the sub-shell 38*b* from a dielectric member that is coated (e.g., plated) with an electrically conductive coating and/or is covered with an electrically conductive shell. Moreover, and for example, the connector shield 54 may be provided by fabricating the frontshell 36, the sub-shell 38*a*, and/or the sub-shell 38*b* from a dielectric member having one or more interior chambers that is at least partially filled with one or more electrically conductive materials. However, it should be understood that the portion of the connector shield 54 that defines the exterior surface 56 of the fitting 44 is provided by a solid metallic material of the frontshell 36 and/or an electrically conductive coating. In embodiments wherein the connector shield 54 includes an electrically conductive coating, the coating may be applied on the dielectric member using any method, process, structure, means, and/or the like, such as, but not limited to, chemical solution deposition (CSD), chemical vapor deposition (CVD), physical vapor deposition (PVD), atomic layer deposition (ALD), electrodeposition, electrocoating, electroplating, electroless plating, plastic plating, screen printing, dip coating, aerosol coating, spin coating, sputtering, and/or the like.

Figure 3:
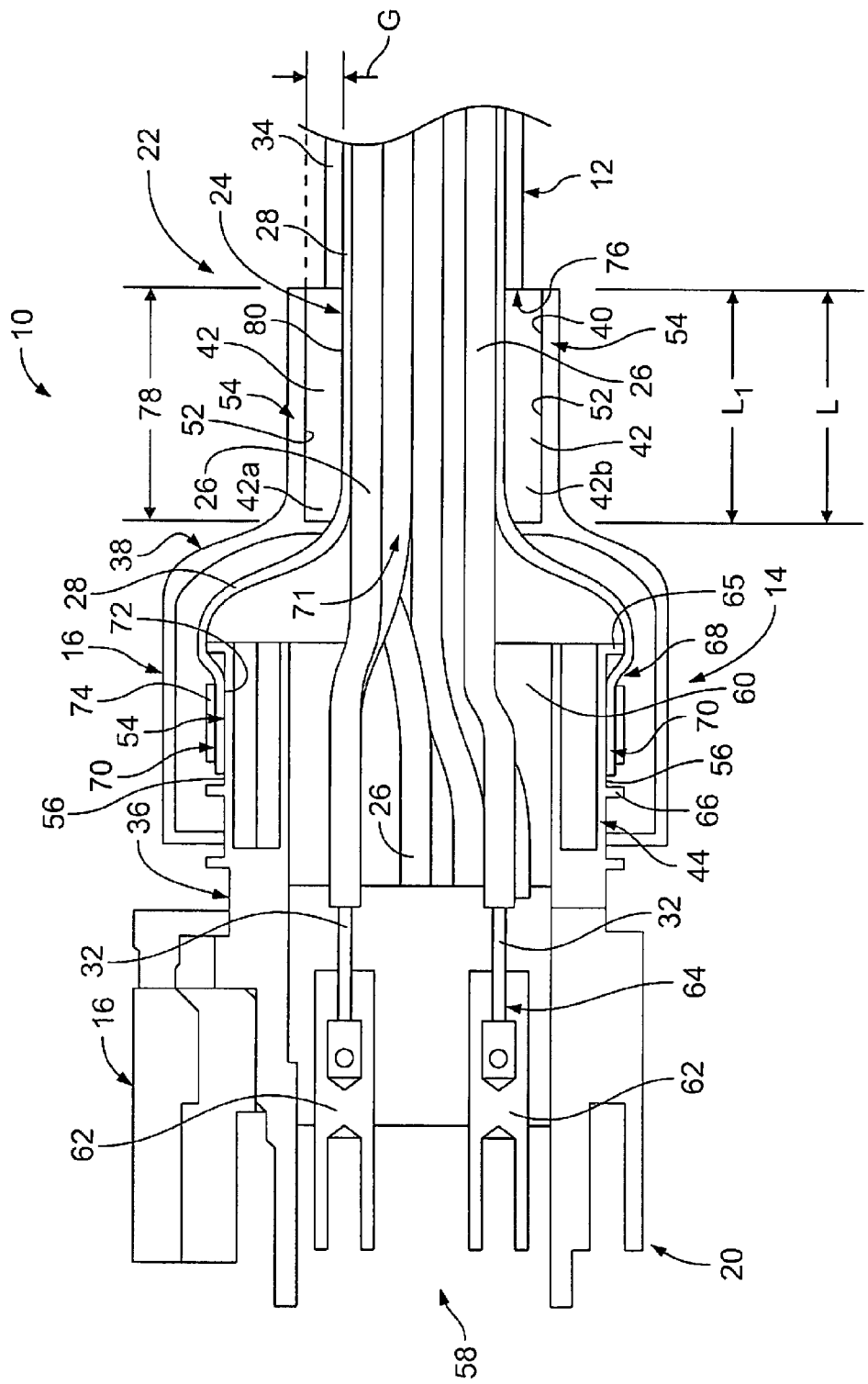
FIG. 3 is a cross-sectional view of the cable assembly shown in FIG. 1.

FIG. 3 is a cross-sectional view of the cable assembly 10. In the illustrated embodiment, the mating end 20 of the housing 16 includes a receptacle 58 that receives a plug (not shown) of the mating connector therein. But, the mating end 20 of the housing 16 may additionally or alternatively include a plug (not shown) that is received within a receptacle (not shown) of the mating connector. In the illustrated embodiment, the frontshell 36 of the housing 16 holds a dielectric insert 60 of the electrical connector 14. The electrical connector 14 includes one or more electrical contacts 62 that are held by the dielectric insert 60 such that the electrical contacts 62 are indirectly held by the frontshell 36 of the housing 16. Alternatively, the electrical connector 14 does not include the dielectric insert 60 and the electrical contact(s) 62 are held directly by the frontshell 36 of the housing 16. As can be seen in FIG. 3, each electrical contact 62 is terminated to an end 64 of the electrical conductor 32 of a corresponding electrical wire 26. The electrical connector 14 may include any number of the electrical contacts 62, which may or may not be the same number as the number of electrical wires 26 of the cable 12.

The fitting 44 of the frontshell 36 includes the exterior surface 56, which includes an outer profile having a circular shape in the illustrated embodiment. The fitting 44 includes a pair of lips or flanges 65 and 66. The flanges 65 and 66 are spaced apart along the length of the fitting 44 such that a recess, or groove, 68 is defined between the flanges 65 and 66.

The end segment 24 of the cable 12 is held by the cable channel 40 of the backshell 38. Specifically, the cable channel 40 holds the end segment 24 of the cable 12 such that the end 70 of the cable shield 28 extends outward away from an open end 71 of the cable channel 40 for electrical engagement with the connector shield 54 of the housing 16. In the illustrated embodiment, the fitting 44 of the frontshell 36 holds an end 70 of the cable shield 28 of the cable 12. Specifically, the end 70 of the cable shield 28 is dressed over the fitting 44 such that the end 70 of the cable shield 28 extends over the flange 65 and into the groove 68 defined between the flanges 65 and 66. The end 70 of the cable shield 28 may be referred to herein as a "termination end".

The end segment 24 of the cable 12 is held within the cable channel 40 such that the cable shield 28 is electrically engaged with, and thereby electrically connected to, the connector shield 54. In the illustrated embodiment, the end 70 of the cable shield 28 is electrically engaged with the fitting 44 of the frontshell 36. Specifically, an interior surface 72 of the cable shield 28 is electrically engaged with the exterior surface 56 of the fitting 44 that is defined by the connector shield 54 to establish the electrical connection between the cable shield 28 and the connector shield 54. The cable shield 28 is thereby electrically connected to the connector shield 54 at the frontshell 36 of the housing 16 such that the cable shield 28 and the frontshell 36 define an electrical shield and/or ground pathway that extends along the cable 28 and the housing 16.

Optionally, the end 70 of the cable shield 28 is held on the fitting 44 at least partially using a radial and/or other type of clamp 74. Stiction, friction, a boot (not shown), and/or another type of device besides the clamp 74 may additionally or alternatively hold the end 70 of the cable shield 28 on the fitting 44. Alternatively to being dressed over the fitting 44, the end 70 of the cable shield 28 may be electrically engaged with the connector shield 54 (whether or not the electrical engagement is at the frontshell 36) using any other structure, means, arrangement, and/or the like, such as, but not limited to, using a split-ring termination arrangement (e.g., the arrangement of the split ring 186 shown in FIG. 5).

Figure 4:
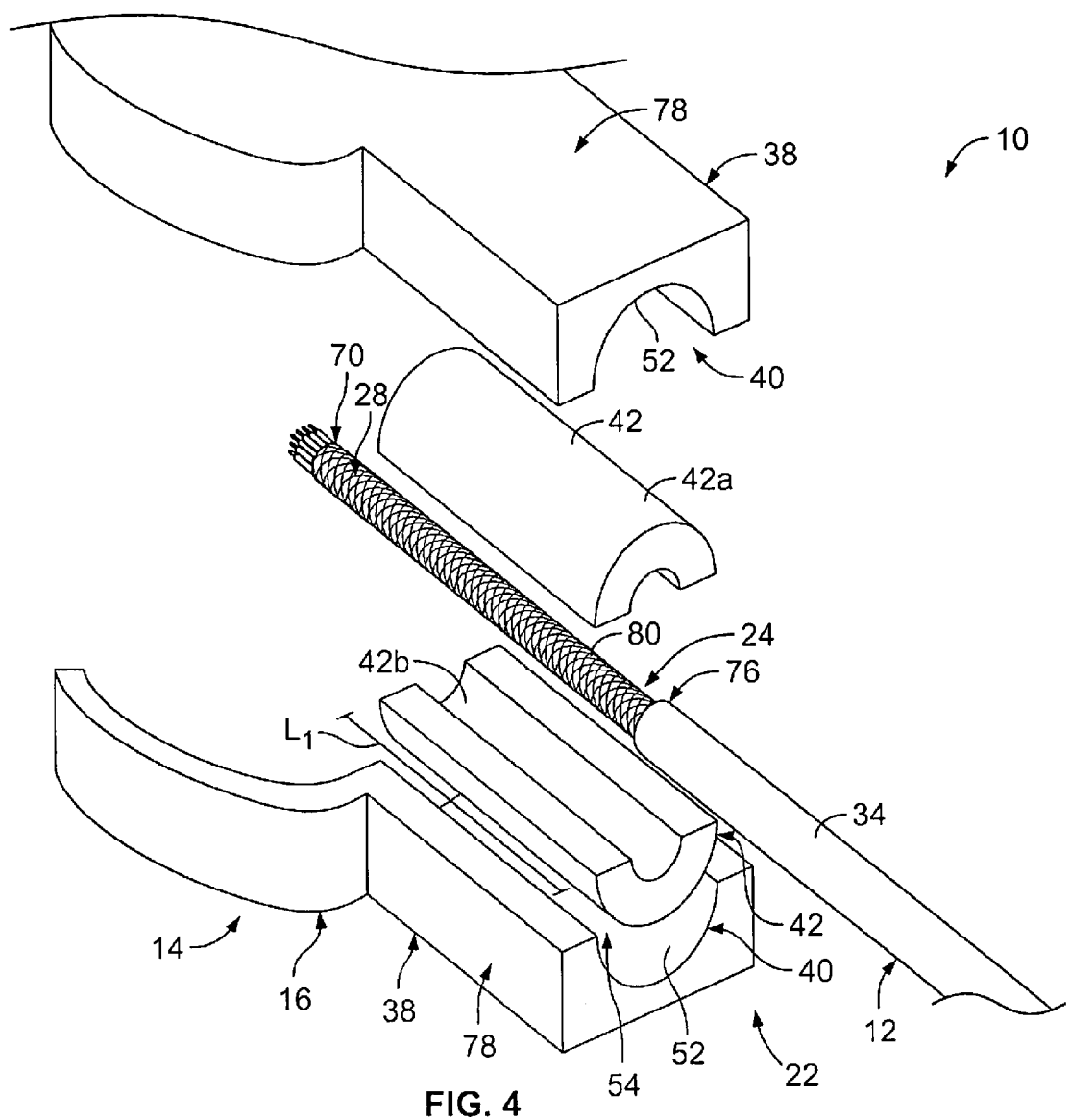
FIG. 4 is an exploded perspective view of a portion of the cable assembly shown in FIG. 1.

FIG. 4 is an exploded perspective view of a portion of the cable assembly 10. Referring now to FIGS. 3 and 4, as briefly described above, the electrical connector 14 includes the EMI absorber 42. The EMI absorber 42 is held within the cable channel 40 of the backshell 38 of the housing 16. The EMI absorber 42 is configured to absorb EMI emitted from the end segment 24 of the cable 12 to reduce or eliminate EMI leakage from the end segment 24.

The EMI absorber 42 is held within the cable channel 40 such that the EMI absorber 42 extends around the cable shield 28 along at least a portion of the length L (not labeled in FIG. 4) of the cable channel 40. The EMI absorber 42 extends a length $L_1$ from an end 76 of the jacket 34 of the cable 12 to the end 70 of the cable shield 28. The EMI absorber 42 may extend circumferentially or peripherally around the cable shield 28 along any portion(s) and amount of the length L of the cable channel 40. In the illustrated embodiment, the EMI absorber 42 extends circumferentially around the cable shield 28 along an approximate entirety of the length L of the cable channel 40. Moreover, and as should be apparent from FIG. 4, the EMI absorber 42 extends around an approximate entirety of the circumference of the cable shield 28 in the illustrated embodiment. But, the EMI absorber 42 may extend around any amount and portion(s) of the circumference of the cable shield 28. In some embodiments, the EMI absorber 42 extends around only a portion of the circumference of the cable shield 28. Optionally, the end 76 of the jacket 34 extends between the EMI absorber 42 and the cable shield 28 along at least a portion of the length L of the cable channel 40. The end 76 of the jacket 34 may be referred to herein as a "jacket end".

A segment 78 of the backshell 38 that extends at the cable end 22 of the housing 16 extends around the circumference of the EMI absorber 42 along at least a portion of the length L of the cable channel 40. In other words, the portion of the backshell 38 which includes the cable channel 40 extends around the circumference of the EMI absorber 42 along at least a portion of the length L of the cable channel 40. The segment 78 defines a tube of the housing 16 within which the EMI absorber 42 extends. In the illustrated embodiment, the segment 78 of the backshell 38 extends around an approximate entirety of the circumference of the EMI absorber 42 along at least a portion of the length L of the cable channel 40. But, the segment 78 of the backshell 38 may extend around any amount and portion(s) of the circumference of the EMI absorber 42.

The portion of the connector shield 54 that extends along the length L of the cable channel 40 of the backshell 38 extends around the circumference of the EMI absorber 42 along at least a portion of the length L of the cable channel 40. The portion of the connector shield 54 that extends along the length L of the cable channel 40 defines a tube of the connector shield 54 within which the EMI absorber 42 is disposed. The portion of the connector shield 54 that extends the length L of the cable channel 40 may extend around any amount and portion(s) of the circumference of the EMI absorber 42. In the illustrated embodiment, the portion of the connector shield 54 that extends along the length L of the cable channel 40 extends around an approximate entirety of the circumference of the EMI absorber 42. Optionally, the connector shield 54 may define an exposed surface (e.g., the interior wall 52) of the backshell 38 that enables the backshell 38 to electrically engage with the EMI absorber 42.

The EMI absorber 42 is disposed between the cable shield 28 and the interior wall 52 that defines the cable channel 40. Specifically, a gap G (not labeled in FIG. 4) is defined between the interior wall 52 of the cable channel 40 and an exterior surface 80 of the cable shield 28. The EMI absorber 42 is held within the cable channel 40 such that the EMI absorber 42 extends within the gap G along at least a portion of the length L of the cable channel 40. In the illustrated embodiment, the EMI absorber 42 fills an approximate entirety of the gap G along at least a portion of the length L of the cable channel 40. But, the EMI absorber 42 may fill any amount of the gap G.

Referring again to FIG. 4, although the EMI absorber 42 is shown as having a cylindrical shape, the EMI absorber 42 may additionally or alternatively include any other shape. The shape of the EMI absorber 42 may or may not be complementary with the shape of the cable channel 40. Moreover, the illustrated embodiment of the EMI absorber 42 includes two discrete sub-pieces 42a and 42b that engage in physical contact with each other (and are optionally mechanically connected together using any suitable means, such as, but not limited to, an adhesive and/or the like) to define a continuous ring of material. But, the EMI absorber 42 may include any number of discrete sub-pieces. For example, in some alternative embodiments, the EMI absorber 42 is a single, unitary piece of material.

Referring again to FIGS. 3 and 4, the EMI absorber 42 has a relatively high permeability to absorb EMI such that the EMI absorber 42 is configured to absorb EMI emitted from the end segment 24 of the cable 12. By absorbing EMI emitted from the end segment 24 of the cable 12, the EMI absorber 42 may reduce or eliminate EMI leakage from the end segment 24 of the cable 12 at the interface between the cable 12 and the electrical connector 14. For example, the EMI absorber may reduce or eliminate EMI leakage from the end segment 24 of the cable 12 at the portion of the end segment 24 that extends within the cable channel 40 and/or from where the end 70 of the cable shield 28 is dressed (i.e., flared) over the fitting 44. In some embodiments, the EMI absorber 42 eliminates substantially all EMI leakage from the end segment 24 of the cable 12. The efficiency of the EMI absorber 42 may depend on the formulation and application (e.g., radial thickness, relative permeability, size, location, and/or the like) of the EMI absorber 42.

The EMI absorber 42 may be fabricated from various materials, such as, but not limited to, a magnetic elastomer, rubber, nitrile, silicon, carbonal iron, a ferrite-based material, a ferrite material in a binder (e.g., a polymer binder), Viton® fluoroelastomer, neoprene, Hypolan® elastomer, urethane, an elastomeric material, and/or the like. The EMI absorber 42 may have magnetic fillers included within an elastomeric material, such as, but not limited to, a carbonyl iron powder, an iron silicide, other magnetic fillers, and/or the like. The type of material within the EMI absorber 42 may be selected to target EMI at different frequencies. In some embodiments, the EMI absorber 42 includes a Q-Zorb™ material, commercially available from Laird Technologies.

Figure 5:
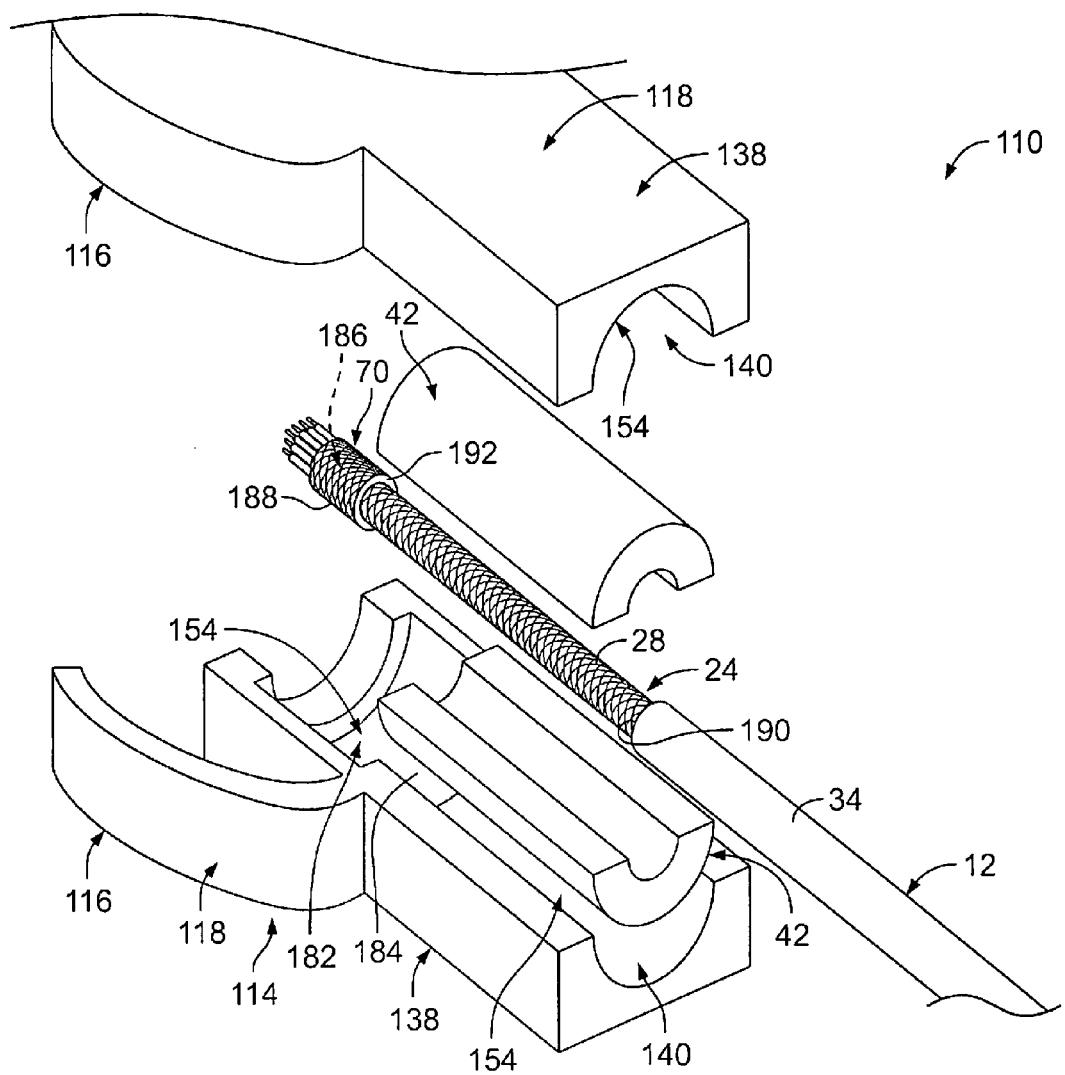
FIG. 5 is an exploded perspective view of a portion of another embodiment of a cable assembly.

FIG. 5 is an exploded perspective view of a portion of another embodiment of a cable assembly 110, which includes the cable 12 and another embodiment of an electrical connector 114. The electrical connector 114 includes a housing 116 having a body 118 that optionally includes a backshell 138. The backshell 138 includes a cable channel 140 that is configured to hold the end segment 24 of the cable 12 therein such that the back shell 138 supports the cable end segment 24.

The housing 116 includes a shield 154 that is electrically conductive to provide electrical shielding for electrical contacts (not shown) of the electrical connector 114 and for the end segment 24 of the cable 12. The shield 154 may define an entirety or a portion of an electrical ground and/or shield pathway along the housing 116. The shield 154 may be referred to herein as a "connector shield".

The connector shield 154 may have any structure and location along the housing 116 that enables the connector shield 154 to electrically engage with the cable shield 28 of the cable 12. For example, in the illustrated embodiment, the backshell 138 includes a split-ring groove 182 having a surface 184 that forms a portion of the connector shield 154. The end 70 of the cable shield 28 is folded over a split-ring 186 and the assembly of the end 70 and the split ring 186 is received within the split-ring groove 182 such that a surface 188 of the end 70 of the cable shield 28 is electrically engaged with the surface 184 of the connector shield 154 to electrically connect the cable shield 28 to the connector shield 154. The split-ring 186 exerts a radially outward force that presses the cable shield 28 against the surface 184 to hold the cable shield 28 in electrical engagement with the surface 184 of the connector shield 154.

In the illustrated embodiment, the cable channel 140 also forms a portion of the connector shield 154. The connector shield 154 extends along a length of the cable channel 140. The connector shield 154 may extend along any portion(s) and amount of the length of the cable channel 140. In the illustrated embodiment, the connector shield 154 extends along an approximate entirety of the length of the cable channel 140.

The electrical connector 114 includes the EMI absorber 42. The EMI absorber 42 is held within the cable channel 140 of the backshell 138. The EMI absorber 142 is configured to absorb EMI emitted from the end segment 24 of the cable 12 to reduce or eliminate EMI leakage from the end segment 24. Optionally, the EMI absorber 42 extends a length that extends continuously from an edge 190 of the jacket 34 of the cable 12 to an edge 192 of the end 70 of the cable shield 28.

The embodiments described and/or illustrated herein may provide a cable assembly of a cable and an electrical connector having a reduced amount of EMI emissions.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector for terminating a cable having a cable shield that is electrically conductive, the electrical connector comprising:
   an electrical contact configured to be terminated to an end of a wire of the cable;
   a housing comprising a body that extends from a mating end to a cable end, the housing comprising a connector shield that is electrically conducive, the electrical contact being held by the housing, the housing being configured to mate with a mating connector at the mating end, the cable end comprising a cable channel that extends through the body and is configured to hold an end segment of the cable therein, a gap being defined between the cable shield and an interior wall of the body of the housing that defines the cable channel, the cable shield being electrically engaged with the connector shield of the housing; and
   an electromagnetic interference (EMI) absorber separate from the housing and held within the cable channel of the body of the housing such that the EMI absorber is configured to extend around the cable shield along at least a portion of a length of the cable channel, the EMI absorber being cylindrical shaped and defining a tube with the cable passing therethrough, the EMI absorber being held within the cable channel such that the EMI absorber is configured to engage the housing along the cable channel and the cable shield to fill an approximate entirety of the gap between the cable shield and the interior wall that defines the cable channel, the EMI absorber being configured to absorb EMI emitted from the cable.

2. The electrical connector of claim 1, wherein the EMI absorber is held within the cable channel such that the EMI absorber is configured to be disposed between the cable shield of the cable and an interior wall of the body of the housing that defines the cable channel.

3. The electrical connector of claim 1, wherein a segment of the cable end of the body of the housing that defines the cable channel extends around an approximate entirety of a circumference of the EMI absorber along at least a portion of the length of the cable channel.

4. The electrical connector of claim 1, wherein the EMI absorber comprises at least one of a magnetic elastomer, a ferrite-based material, carbonal iron, or a ferrite material in a binder.

5. The electrical connector of claim 1, wherein the cable includes an insulative jacket that extends around the cable shield, the cable channel being configured to hold the end segment of the cable therein such that a termination end of the cable shield extends outward and forward away from an open end of the cable channel for electrical engagement with the connector shield of the housing, wherein the EMI absorber is configured to extend from a jacket end of the insulative jacket forward toward the termination end of the cable shield.

6. The electrical connector of claim 1, wherein the cable includes an insulative jacket that extends around the cable shield, the cable channel being configured to hold the end segment of the cable therein, wherein the EMI absorber is configured to extend forward from an edge of the insulative jacket toward the end of the cable shield, wherein at least a portion of the insulative jacket is received in the cable channel rearward of the EMI absorber in the cable channel.

7. The electrical connector of claim 1, wherein the EMI absorber is configured to extend around an approximate entirety of a circumference of the cable shield for the length of the EMI absorber.

8. The electrical connector of claim 1, wherein the body of the housing is fabricated from a solid metallic material such that the body defines the connector shield.

9. The electrical connector of claim 1, wherein the body of the housing comprises a dielectric member, the connector shield comprising at least one of:
   an electrically conductive coating that coats the dielectric member; or
   an electrically conductive material that at least partially fills one or more interior chambers of the dielectric member.

10. The electrical connector of claim 1, wherein the body of the housing comprises a frontshell and a backshell, the frontshell comprising the mating end of the body of the housing and extending to a fitting at a rear end of the frontshell, the fitting being terminated to the cable shield, the backshell being mounted to the frontshell and comprising the cable end of the body of the housing, the backshell including the cable channel and the EMI absorber being received in the backshell.

11. A cable assembly comprising:
   a cable having an end segment, the cable comprising a wire and an electrically conductive cable shield that extends around the wire, the cable shield extending to a termination end; and
   an electrical connector terminated to the end segment of the cable, the electrical connector comprising:
      an electrical contact terminated to the wire of the cable;
      a housing extending from a mating end to a cable end, the housing comprising a connector shield that is electrically conducive, the electrical contact being held by the housing, the housing being configured to mate with a mating connector at the mating end, the cable end comprising a cable channel that holds the end segment of the cable therein, a gap being defined between the cable shield and an interior wall of the body of the housing that defines the cable channel, the termination end being forward of the cable channel and the cable shield is electrically engaged with the connector shield of the housing forward of the cable channel; and an electromagnetic interference (EMI) absorber held within the cable channel of the housing such that the EMI absorber extends around the cable shield along at least a portion of a length of the cable channel, the EMI absorber being held within the cable channel such that the EMI absorber is configured to engage the housing along the cable channel and the cable shield to fill an approximate entirety of the gap between the cable shield and the interior wall that defines the cable channel, the EMI absorber being configured to absorb EMI emitted from the cable.

12. The cable assembly of claim 11, wherein the EMI absorber is held within the cable channel such that the EMI absorber is disposed between the cable shield and an interior wall of the body of the housing that defines the cable channel.

13. The cable assembly of claim 11, wherein the EMI absorber comprises at least one of a magnetic elastomer, a ferrite-based material, carbonal iron, or a ferrite material in a binder.

14. The cable assembly of claim 11, wherein the EMI absorber is positioned rearward of the termination end of the cable.

15. An electrical connector for terminating a cable having a cable shield that is electrically conductive, the electrical connector comprising:

an electrical contact configured to be terminated to an end of a wire of the cable;

a housing extending from a mating end to a cable end, the housing comprising a connector shield that is electrically conducive, the electrical contact being held by the housing, the housing being configured to mate with a mating connector at the mating end, the cable end comprising a cable channel that is defined by an interior wall of the housing, the cable channel being configured to hold an end segment of the cable therein, a gap being defined between the cable shield and an interior wall of the body of the housing that defines the cable channel, the cable shield is electrically engaged with the connector shield; and an electromagnetic interference (EMI) absorber separate from the housing and being held within the cable channel such that the EMI absorber is configured to be disposed between the cable shield of the cable and the interior wall of the housing along at least a portion of a length of the cable channel, the EMI absorber being held within the cable channel such that the EMI absorber is configured to engage the housing along the cable channel and the cable shield to fill an approximate entirety of the gap between the cable shield and the interior wall that defines the cable channel, the EMI absorber having a high permeability to absorb EMI emitted from the cable.

16. The electrical connector of claim 15, wherein the EMI absorber comprises at least one of a magnetic elastomer, a ferrite-based material, carbonal iron, or a ferrite material in a binder.

17. The electrical connector of claim 15, wherein the body of the housing comprises a frontshell and a backshell, the frontshell comprising the mating end of the body of the housing and extending to a fitting at a rear end of the frontshell, the fitting being terminated to the cable shield, the backshell being mounted to the frontshell and comprising the cable end of the body of the housing, the backshell including the cable channel and the EMI absorber being received in the backshell.

18. The cable assembly of claim 11, wherein the body of the housing comprises a frontshell and a backshell, the frontshell comprising the mating end of the body of the housing and extending to a fitting at a rear end of the frontshell, the fitting being terminated to the cable shield, the backshell being mounted to the frontshell and comprising the cable end of the body of the housing, the backshell including the cable channel and the EMI absorber being received in the backshell.

* * * * *